United States Patent [19]
Borden

[11] Patent Number: 5,883,518
[45] Date of Patent: Mar. 16, 1999

[54] SYSTEM AND METHOD FOR MEASURING THE DOPING LEVEL AND DOPING PROFILE OF A REGION IN A SEMICONDUCTOR SUBSTRATE

[75] Inventor: Peter G. Borden, San Mateo, Calif.

[73] Assignee: Boxer Cross, Inc., Menlo Park, Calif.

[21] Appl. No.: 638,944

[22] Filed: Apr. 24, 1996

[51] Int. Cl.⁶ ................................................... G01R 31/28
[52] U.S. Cl. ........................ 324/752; 324/765; 324/750
[58] Field of Search ................................... 324/719, 716, 324/750, 751, 752, 765, 766, 767; 250/492.1, 492.2, 310–311; 437/8; 257/40; 438/14, 15, 17, 18

[56] References Cited

U.S. PATENT DOCUMENTS

| | | | |
|---|---|---|---|
| 4,851,768 | 7/1989 | Yoshizawa et al. | 324/751 |
| 5,006,795 | 4/1991 | Yoshizawa et al. | 324/751 |
| 5,034,683 | 7/1991 | Takahashi et al. | 324/753 |
| 5,037,202 | 8/1991 | Batchelder et al. | |
| 5,061,070 | 10/1991 | Batchelder et al. | |
| 5,103,182 | 4/1992 | Moslehi | 324/719 |
| 5,133,602 | 7/1992 | Batchelder et al. | |
| 5,546,011 | 8/1996 | Takaha et al. | 324/753 |
| 5,585,735 | 12/1996 | Takahashi et al. | 324/753 |

OTHER PUBLICATIONS

W. Murray Bullis, SEMI (Jan., 1996) "Characterizing microroughness and haze on silicon wafers"—pp. 47–53.
M.A. Nokes, P.B. Borden, Pacific Scientific Co., Sunnyvale. CA (no date indicated) "Differential Interference Contrast Imaging in the Optical Production Profiler".

Primary Examiner—Vinh P. Nguyen

[57] ABSTRACT

A system for measuring the doping levels of a doped region in a semiconductor substrate, wherein an analyzer beam and a reference beam are generated, the analyzer and reference beams being substantially parallel and spaced apart from each other so that the analyzer and reference beams are non-overlapping. The analyzer beam is focused on a preselected doped region of the substrate and the reference beam is focused on an undoped region of the substrate, the doped region generating a phase shift of the analyzer beam relative to the reference beam corresponding to a level of doping of the doped region of the substrate. A detector detects the phase shift of the analyzer beam relative to the reference beam, and the doping level of the substrate in the preselected doped region is determined from the phase shift. The doping level measuring system may be used to control a semiconductor fabrication process.

43 Claims, 7 Drawing Sheets

SYSTEM AND METHOD FOR MEASURING THE DOPING LEVEL AND DOPING PROFILE OF A REGION IN A SEMICONDUCTOR SUBSTRATE

BACKGROUND OF THE INVENTION

This invention relates generally to a system and method for measuring the doping levels and doping profiles of a semiconductor substrate, and in particular to a system and method for measuring the doping level or doping profile of a semiconductor substrate in a semiconductor fabrication line environment.

In the fabrication of electrical active or passive devices on a semiconductor substrate, one of the most critical processes is a doping process in which impurity atoms, such as boron, phosphorus, or arsenic, are imbedded into the semiconductor substrate using various methods, such as ion implantation or diffusion. These impurities are imbedded within the semiconductor substrate, and the area is known as a doped region, and the doped region has a certain doping profile. The doping profile is the doping levels of the doped region at various points in the area of the doped region. The impurities within the semiconductor substrate determine the semiconductor substrate's conductivity, which is how well charge carriers move through a substrate. The careful control of this doping profile is critical in order to obtain an active or passive device, such as transistors, diodes, resistors, or capacitors, on the semiconductor substrate with desired electrical properties.

As indicated above, there are two conventional methods for forming a doped region in a semiconductor substrate. These methods form doped regions with profiles that may differ. In the ion implantation method, impurity atoms are accelerated, strike the surface of the semiconductor substrate, and penetrate the surface where the impurity atoms collide with the substrate lattice and stop. The substrate is then annealed (i.e, heated to high temperatures on the order of 1000° C.). The doping profile for an ion implantation method is gaussian in shape (i.e., a curve with a peak near the surface of the substrate). In the diffusion method, the substrate is heated to a high temperature in a chamber that also contains a gas that has impurity atoms suspended in the gas. The impurity atoms in the gas diffuse into the substrate, and form a doping profile that is described by a complementary error function, which is well known function. The doping region may also be generated by a combination of methods where, for example, the substrate surface may be heavily doped with impurity atoms at low energy levels, and then the impurity atoms are diffused into the substrate by heating the substrate.

It is desirable to be able to accurately measure the doping profile of a device, whether it is active or passive, formed on the semiconductor substrate. It is also desirable to measure doping profiles of a semiconductor substrate during fabrication of the substrate to permit real-time control of a fabrication line and to vary the fabrication process. There are a number of conventional methods for determining the doping profile. One is a spreading resistance method in which probes are placed on the surface of the substrate, and the voltage drop across the probes is measured in response to an applied current. This method for measuring the doping profile requires too much area of the substrate surface so that is cannot be used with production substrates and cannot be used for real time control of a fabrication line. In addition, the method requires that the probes directly contact the substrate surface, which is undesirable.

Another method of measuring the doping profile of the semiconductor substrate is known as capacitance-voltage (C-V) profiling in which a junction is formed at the substrate surface, biased with a voltage, and a measurement of the capacitance of the junction as a function of the voltage applied across the junction permits the doping profile to be measured. This method also requires that probes are connected to the substrate and has the same drawbacks as the spreading resistance probe method.

The doping profile may also be measured indirectly by a method, known as Thermaprobe, in which the substrate is heated by a laser beam, and the response of the substrate to the heating is measured. This method is normally used after ion implantation, but only measures the damage caused to the substrate by the ion implantation, not the doping profile of the substrate. This method also is used prior to annealing to make the impurity atoms electrically active. Some other conventional methods include Hall effect measurements, Fourier transform infrared determination, secondary ion mass spectrometry, and plasma resonance.

None of these conventional methods of measuring the doping profile of the semiconductor substrate can be used as process monitors for real-time control in a fabrication line to measure the doping profiles of semiconductor substrate devices as they are being manufactured. The conventional methods are difficult to use and many require as area of the substrate that is so large as to preclude use of the method on production substrates in a fabrication process. They also have a limited range of resolutions that cannot measure the doping levels of the smaller semiconductor devices that are being manufactured, and may require direct contact with the surface of the substrate. Thus, these systems cannot be used as process monitors for real-time control of a fabrication line.

Therefore, there is a need for a system and method for real-time monitoring and measurement of doping profiles of doped regions in a semiconductor substrate to control the fabrication process which avoid these and other problems of known systems and methods, and it is to this end that the invention is directed.

SUMMARY OF THE INVENTION

The invention provides a system for measuring the doping level and doping profile of a region of a semiconductor substrate wherein the doping level is measured directly by measuring a phase shift of an analyzer beam relative to a reference beam caused by the doping level of the region. The system also measures the doping profiles of the region of the substrate by scanning the analyzer and reference beam across the region to generate a plurality of doping level measurements that may be combined together to obtain a doping profile of the region of the substrate. The system also measures the doping levels and doping profiles of the region of the semiconductor substrate without any physical contact with the substrate surface. The analyzer beam and reference beam are close together, thereby permitting the accuracy of the doping level measuring system to be increased. Further, the beams are of very small dimensions which allows the system in accordance with the invention to be used on production substrates during fabrication.

The doping level measuring system also monitors and measures the doping levels of regions of the semiconductor substrate in a fabrication process in order to control the fabrication process in real time. Thus, an error in the doping level of a region of the substrate may be rapidly identified and the fabrication process may be changed in real time to provide tight control of the fabrication process.

In accordance with the invention, a system for measuring doping levels of a doped region in a semiconductor substrate has a system for generating an analyzer and reference beam, the analyzer and reference beams being substantially parallel and spaced apart from each other so that the analyzer and reference beams are substantially non-overlapping. The analyzer beam is focused on a preselected doped region of the substrate and the reference beam is focused on an undoped region of the substrate, the doped region generating a phase shift of the analyzer beam relative to the reference beam corresponding to a level of doping of the doped region of the substrate. A detector detects the phase shift of the analyzer beam relative to the reference beam, and the doping level of the substrate in the preselected doped region is determined from the phase shift.

DETAILED DESCRIPTION OF A PREFERRED EMBODIMENT

The invention is particularly applicable to a system and method for measuring the doping level and doping profile of an electrical active or passive device formed on a semiconductor substrate. It is in this context that the invention will be described. It will be appreciated, however, that the system and method in accordance with the invention has greater utility.

To understand the invention, it is necessary to understand the physical parameters and the operation of a device formed on a semiconductor substrate. In particular, the parameters and operation of an n-channel field effect transistor (FET) will be described with reference to FIG. 1. However, the system and method in accordance with the invention may also be used with other types of devices formed on or in a substrate, such as a bipolar transistor, a p-channel FET, a complementary metal oxide semiconductor (CMOS) FET, and capacitors or resistors.

Figure 1:
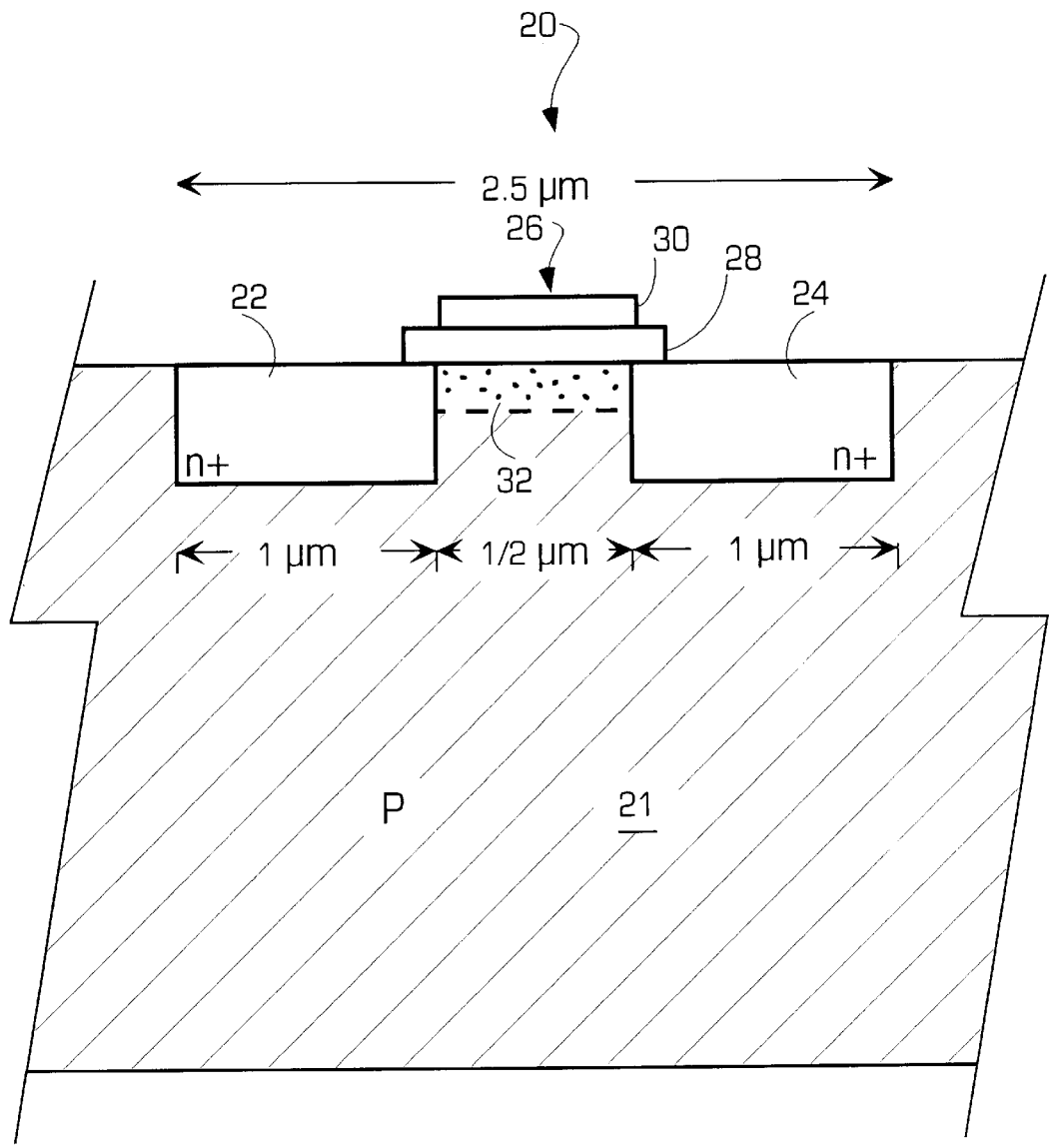
FIG. 1 is a diagrammatic view of a portion of a field effect transistor (FET) transistor.

FIG. 1 is a diagram of an n-channel field effect transistor (FET) 20 formed in a semiconductor substrate 21 which may be silicon, but may also be gallium arsenide, indium phosphide, or any other type of substrate used for forming semiconductor devices. In this example, the substrate is a P-type substrate, and a n-channel FET is formed. A P-type substrate has positively charged majority carriers (holes), such as atoms with missing electrons, that carry current. Similarly, electrons, known as minority carriers, also carry current. The FET 20 includes a pair of regions 22, 24 that have been doped (i.e., changed atoms have been added) so that their regions now have more negative charge carriers than the substrate. The doping of these regions is well known and will not be described here in detail. In an FET, the first region 22 is known as a source, and the second region 24 is known as a drain. The FET 20 also has a region 26, known as a gate. The gate 26 has an insulating layer 28, that may be silicon dioxide, and a gate electrode 30, that may be made from a polysilicon material. As shown, the FET 20 is 2.5 micrometers (microns) wide, the source and drain are 1 micron wide each, and the gate is 0.5 microns wide. The operation of the FET shown will now be briefly described.

The FET is basically an electrical switch that may be turned on or off by the application of a voltage to the gate. In particular, the application of a positive voltage, for this particular n-channel FET, to the gate electrode 30 attracts electrons to the surface of the substrate in a region 32 between the source 22 and the drain 24. This region is known as a channel. Since the substrate is P-type (i.e., has more positive carriers than negative carriers), the electrons attracted to the channel are minority carriers, and the channel is known as an n-channel. The gate insulating layer 28 prevents the electrons in the channel from flowing to the gate electrode 30. Once sufficient positive voltage has been applied to the gate electrode 30, the electrons in the channel form a conducting inversion layer that permits current to flow from the source region 22, through the channel 32 and out the drain region 24. In this state, the FET is turned on. Without sufficient positive voltage applied to the gate, the FET is in an off state and current does not flow from the source to the drain. The gate voltage may be varied to increase or decrease the amount of current that flows from the source region to the drain region.

One of the critical parameters of an active device, such as a transistor, formed on a semiconductor substrate, is the doping level of various regions of the transistor. As shown above, the source and drain regions of the transistor are doped so that they have more minority carriers (electrons) than the rest of the transistor. Thus, it is desirable to measure the doping levels and doping profiles of these doped regions. The measuring system, in accordance with the invention, accurately and directly measures the doping levels and doping profiles of these regions, as described below. In addition, the doping level measuring system, in accordance with the invention may also be used for real-time monitoring and measurement of doping levels of partially manufactured active devices in a semiconductor substrate to permit control of a fabrication process, as described below with reference to FIG. 6. A transmissive type doping level measuring system will now be described.

Figure 2:
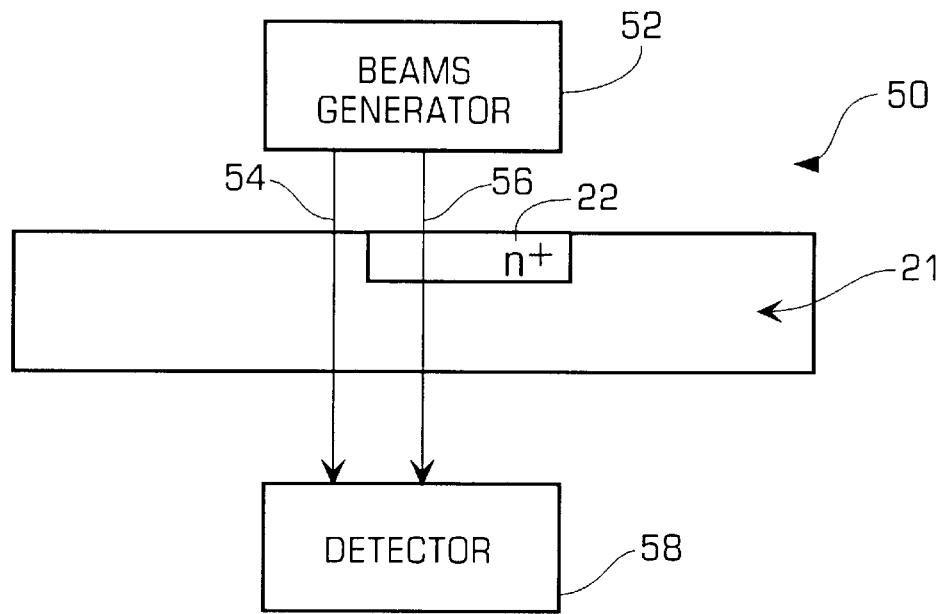
FIG. 2 is a block diagram of a transmissive type first embodiment of a doping profile measuring system, in accordance with the invention.

FIG. 2 is a block diagram of a transmissive type first embodiment of a measuring system 50, in accordance with the invention. A reflective type doping level measuring system, in accordance with the invention, will be described below with reference to FIGS. 4 and 5. The doping level measuring system 50 may include a beam generator 52 that generates an electromagnetic radiation reference beam 54 and an electromagnetic radiation analyzer beam 56 that are closely spaced apart from each other, but do not overlap, and may preferably be 1 $\mu$m apart. The analyzer beam and reference beam may be coherent radiation and may have different polarizations so that they may be combined into a single beam, as described below. The analyzer beam and the reference beam have a wavelength that is selected so that both beams pass through the substrate (i.e., the substrate is transparent to the beams). A wavelength for the analyzer beam and the reference beam may be greater than 1100 nanometers and preferably may be about 1300 nanometers for a silicon substrate. The beams also have a photon energy, Eg, which is less than the band gap for the substrate so that the beams pass through the substrate. The photon energy, as is well known, is related to the wavelength of the beams. If another type of substrate is being measured, such as gallium arsenide or indium phosphide, then a different wavelength may be selected so that the beams pass through the substrate with minimal absorption.

These two beams are then focused on the substrate 21, and the substrate is positioned so that the analyzer beam 56 passes through the doped region 22 of the substrate, such as the source region of an FET. The doped region has excess charge carriers due to the doping process as described above. The analyzer beam may also be used to measure the doping levels of other doped regions of a transistor, such as a drain, an N-well, or a P-well. The excess charge carriers in the doped region of the substrate causes the index of refraction of the doped region to increase. The increase in the index of refraction causes the analyzer beam to pass more slowly through the doped region, resulting in a phase shift of the analyzer beam compared to a beam passing thorugh a region of different doping.

The reference beam 54 is positioned so that it passes through an undoped region of the substrate, that may be near the doped region. The undoped region has a lower index of refraction than the doped region because the undoped region has fewer charge carriers. Since the reference beam is passing through an undoped region of the substrate with a lower index of refraction, the reference beam is not slowed down as much as the analyzer beam. This difference between the time it takes the analyzer beam and the reference beam to pass through the substrate causes a phase shift of the analyzer beam relative to the reference beam. This phase shift, as described below, may be detected by a detector 58. The detector generally measures the electric fields of the analyzer beam and the reference beam, and determines a phase shift, as described below. The detector may also determine the doping level of the doped region of the substrate from the phase shift, as described below.

The phase shift and doping level for the transmissive type doping level measuring system may be determined in the following manner. The electric field of the reference beam, $E_{reference}$ (i.e., the beam that is not phase shifted), is known and may be expressed as:

$$E_{reference} = E_0 e^{j(wt-kz)} \tag{1}$$

where $E_0$ is the amplitude (power) of the beam, and may be determined because $$E_0 = \sqrt{\frac{P_l}{2}} \tag{2}$$

where $P_1$ is the power of the generator used to generate both the beams. In addition, ω is the frequency of the electric field, k is the wavenumber ($k=2\pi/\lambda$) of the analyzer reference beam, and z is the depth of the doped region being measured. Thus, the electric field of the reference beam has an amplitude component, and a frequency component that is a sine wave.

Similarly, the electric field of the phase shifted analyzer beam, $E_{analyzer}$, is also known and is a function of the amplitude, $E_0$, and a frequency component. However, unlike the electric field of the reference beam, the electric field of the analyzer beam is also dependant on the phase shift, $\Delta\phi$, in the following equation:

$$E_{analyzer} = E_0 e^{j(\omega t - kz)} e^{j\left(\Delta\phi + \frac{\pi}{2}\right)} \tag{3}$$

where π/2 is a fixed phase shift between the two beams.

The sum and difference of these two electric fields, $E_{reference}$ and $E_{analyzer}$, may be determined by a polarizing beam splitter, as described below, oriented at 45°, so that the resultant electric field at one detector is $E_{reference}+E_{analyzer}$, and the electric field at the other detector is $E_{reference}-E_{analyzer}$. The signal (power) at each detector is:

$$P_{1,2} = P_l\left(1 \pm \frac{1}{2}\cos\left(\Delta\phi + \frac{\pi}{2}\right)\right) = P_l\left(1 \pm \frac{1}{2}\sin(\Delta\phi)\right) \tag{4}$$

where $P_{1,2}$ are the powers (voltages) of the signal at each detector, $P_s$ is the power of the beam generated by the analyzer beam generator, and $\Delta\phi$ is the phase shift. Then, if the signals at the two detectors are subtracted from each other, a relationship between the power of the signal, $P_s$ the phase shift, $\Delta\phi$, is generated where:

$$P_s = P_1 \sin(\Delta\phi) \approx P_1 \Delta\phi \tag{5}$$

Thus, since the power of the source, $P_1$, may be measured, one may determine the phase shift of the analyzer beam relative to the reference beam using the above analysis.

The doping level of a doped region of the substrate may then be determined from the phase shift. A relationship between the phase shift of the analyzer beam, $\Delta\phi$, and a change in the index of refraction of the substrate, $\Delta n(z)$, is known and is given by the following equation:

$$\Delta\phi = k\int \Delta n(z) dz \tag{6}$$

where k is the wavenumber ($k=2\pi/\lambda$) of the incident radiation. In this system, the change of index of refraction, $\Delta n(z)$, is a function of the depth, z, of the doped region.

The index of refraction, n(z), of the substrate is a function of the conductivity of the substrate, wherein:

$$n^2(z) = \frac{\epsilon}{2}\left\{1 + \left[\left(\frac{2\lambda\sigma_0}{\rho c \epsilon}\right)^2\right]^{1/2}\right\} \tag{7}$$

where ε is the dielectric constant of the substrate, λ is the wavelength of the incident radiation, ρ is the resistivity of the doped region of the substrate, c is the speed of light, and $\sigma_0$ is a conversion constant of $9\times10^{11}$ ohm-cm/sec assuming the resistivity is in ohm-cm units, the speed of light is in cm/sec units, and the wavelength is in cm units. In most cases, $\Delta n(z)$ is small so that the above equation reduces to:

$$\Delta n(z) = \frac{n_0}{2}\left(\frac{\sigma_0 \lambda}{\rho(z) c \epsilon}\right)^2 \tag{8}$$

where $n_0 = \epsilon^{1/2}$. Thus, a relationship between the change in index of refraction of the substrate and the resistivity of the doped region of the substrate exists.

If the above relationship between the change in index of refraction of the substrate and the resistivity of the doped region of the substrate, and the relationship between the phase shift and the change in index of refraction are combined, then a relationship between the phase shift, $\Delta\phi$, and the resistivity, $\rho(z)$ is given by:

$$\Delta\phi = k\frac{n_0}{2}\left(\frac{\sigma_0\lambda}{\epsilon c}\right)^2 \cdot \int_0^T \frac{dz}{\rho(z)^2} \tag{9}$$

where T is the thickness of the doped region of the substrate, and the other variables have been described above. Thus, since the phase shift, $\Delta\phi$, has been determined, as described above, one can determine the resistivity, $\rho$, of the doped region. From the resistivity of the region, the conductivity of the doped region, $\sigma$, may be determined, since it is known that:

$$\sigma = \frac{1}{\rho} \tag{10}$$

From the conductivity of the doped region, the concentration of the electrons and holes in the substrate may be determined since:

$$\sigma = q(n\mu_n p\mu_p) \tag{11}$$

where n is the concentration of minority carriers, $\mu_n$ is the mobility of the minority carriers (electrons), p is the concentration of the majority carriers (holes), $\mu_p$ is the mobility of the majority carriers, and q is the electron charge constant.

Thus, the concentration of carriers may be determined, which corresponds to the doping level of the doped region, as is well known in the art. In addition, if a plurality of doping level measurements are made at different locations within the doped region, the two-dimensional doping profile of the doped region (i.e., the doping levels at various locations) may also be measured, in accordance with the invention. The depth profile is found by fitting the assumed distribution into Equation (9). In order to measure the doping levels of various locations within the doped region, the substrate may be incrementally moved, as described below, or the beams may be moved, or both the beams and the substrate may be moved.

Figure 3:
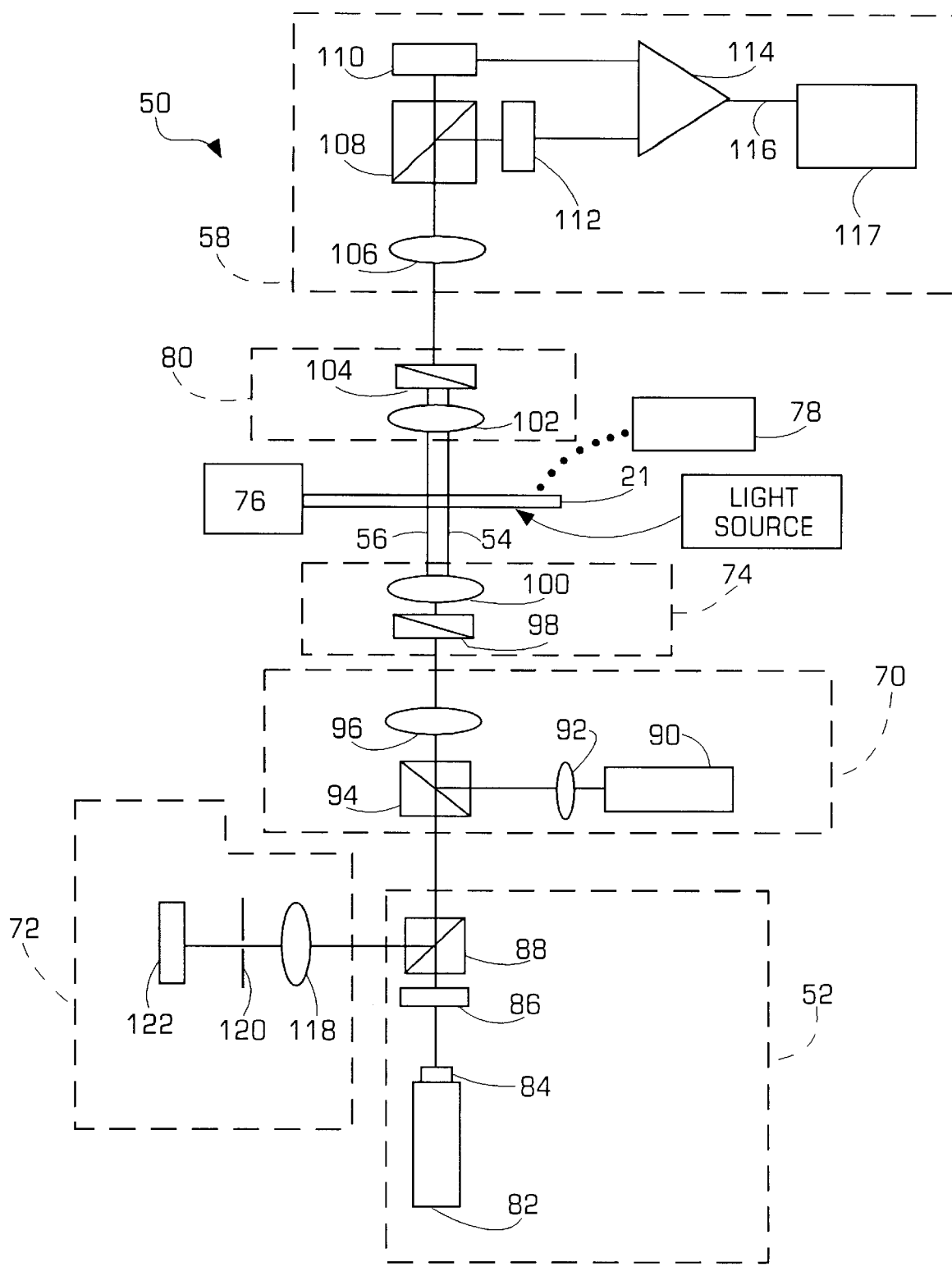
FIG. 3 is a more detailed block diagram of the transmissive type doping profile measuring system of FIG. 2.

FIG. 3 is a more detailed block diagram of the transmissive type first embodiment of the doping level measuring system 50 that may include the beam generator 52 and the detector 58, as described above, and a substrate examining system 70, a substrate aligning system 72, a focusing system 74, a substrate positioning system 76, a substrate biasing system 78, and a beam combining system 80. The beam generator system 52 may include a coherent electromagnetic radiation generation means 82, such as a laser, that generates an electromagnetic beam that may have a wavelength of more than 1100 nanometers, and preferably about 1300 nanometers, for a silicon substrate. The wavelength of the beam generated varies depending on the type of substrate being measured, such as silicon, indium phosphide, or gallium arsenide. The beam generator system also may have an isolator 84 for preventing light from reflecting back into the laser, and a waveplate 86 that produces a circularly polarized beam that has two orthogonal polarization components that may be shifted 90° in phase. A beam splitter 88 reflects some electromagnetic energy that has been reflected back from the surface of the substrate into the substrate aligning system 72, as described below. The beam from the beam generator passes through the beam splitter 88 and enters the substrate examining system 70.

The substrate examining system 70 permits a user to examine the substrate along the same optical axis as the analyzer beam and may include a video camera 90, a first lens 92, a beam splitter 94, and a second lens 96. The first and second lenses provide magnification to the video camera so that the user of the doping level measuring system may easily examine and locate the regions of the substrate. The beam splitter 94 combines an examining beam that is received by the video camera with the beam from the beam generator. Thus, the user of the substrate examining system may precisely position the substrate because the optical axis of the video camera is the same as the optical axis of the beam from the beam generator.

Once the beam has passed through the substrate examining system, as described above, the beam enters the focusing system 74 that separates the beam into the analyzer beam and the reference beam and focuses both beams on the substrate, and may include a separation means 98, and an microscope objective 100. The separation means may be a Wollaston prism, which separates the beams into two closely spaced separate beams, an analyzer beam and a reference beam. The separation of the two beams is adjustable, but may preferably be about 1 micron. The two beams do not overlap to prevent interference of one beam with the other. The microscope objective focuses the beams onto the surface of the substrate.

After the analyzer and reference beams have passed through the substrate 21, they enter the combining system 80 that may include a lens 102 for focusing the beam onto a combining means 100. The combining means may be a Wollaston prism which recombines the analyzer and reference beams into a single beam with two orthogonally polarized components, which correspond to the analyzer beam and reference beam. The combining means does not interfere the analyzer beam with the reference beam when it combines them due to the different polarizations of the two beams.

The single beam generated by the combining system 80 then enters the detector 58 that may detect the phase shift of analyzer beam relative to reference beam and determine the doping level of the doped region, and may include a lens 106 for collimating the single beam and focusing it onto a beam splitter 108 that is located at a 45° angle to the two orthogonal polarizations of the components of the beam. The beam splitter, due to the 45° angle, produces a sum of the electric fields of the analyzer beam and the reference beam signal at a first detector 110, and a difference of the electric fields of the two beams signal at a second detector 112. The detectors 110, 112 output a voltage corresponding to the sum and difference signal, respectively. The outputs of the detectors may be subtracted from each other by a subtractor 114, such as a differential amplifier, to produce an electrical signal corresponding to the phase shift of the analyzer beam relative to the reference beam, as described above. The detector 58 may also have a processor 117 for determining the doping level of the doped region of the substrate, as described above.

The substrate aligning system 72 permits the precise positioning of the beam focus at the surface of the substrate, and may include a lens 118 for focusing the electromagnetic radiation from the beam splitter 88, a pinhole 120, and a detector 122. When the substrate is correctly positioned, the spot of light at the pinhole is of a minimum size which produces a maximum signal from the detector 122 because the minimum spot size, means that the maximum amount of light is received by the detector.

The substrate may be positioned by the substrate positioning system 76 that may include a stage (not shown) for supporting and moving the substrate in any direction. The substrate positioning system 76 may be used to initially position the substrate, and may also be used to move the substrate in order to generate doping profiles of a doped region of the substrate. The substrate biasing system 78 may provide a cloud containing charge carriers that settle on the surface of the substrate, and electrically bias the substrate.

To compensate for a thin film that might cover the undoped region of the substrate, a light source (not shown) with a wavelength shorter than the bandgap of the substate is shined on the surface of the substrate so that a carrier concentration is generated in the substrate. At this high energy intensity level, the conductivity and index of refraction of the substrate is the same underneath both beams because the index of refraction change caused by carriers generated by the high intensity beam is much greater than any index of refraction caused by the doped region so that any phase shift between the two beams is a result of the thin film. In this manner, the phase shift due to the thin film may be determined and compensated for by the system.

Figure 4:
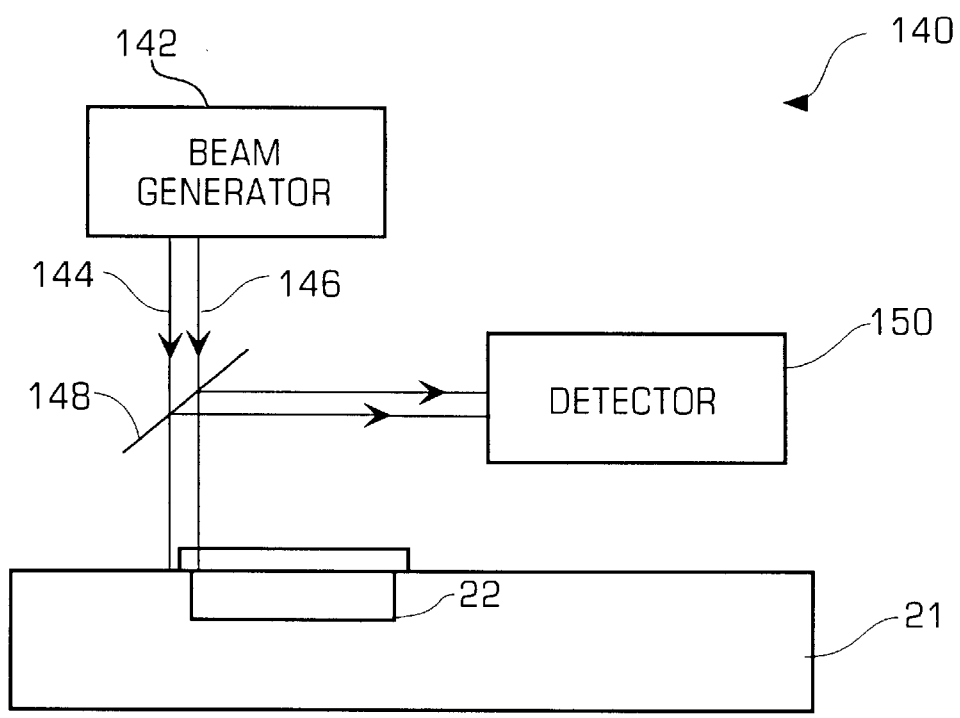
FIG. 4 is a block diagram of a reflective type second embodiment of the doping level measuring system.

A reflective type second embodiment of the doping level measuring system in accordance with the invention will now be described. FIG. 4 is a block diagram of a reflective type second embodiment of the doping level measuring system 140. The reflective type doping level measuring has a few advantages. First, as described below, the beams do not pass through the substrate, but reflect off of it so a shorter wavelength beam may be used which means that a smaller spot size is obtained. The shorter wavelength beam, however is absorbed by the surface of the substrate so the doping of doped regions deep within the substrate may be harder to measure. The reflective type measuring system may include a beam generator 142 that produces a reference beam 144 with a first polarization, and an analyzer beam 146 with a second polarization, as described above. The beam generator of this reflective type system, however, produces shorter wavelength beams of electromagnetic radiation, such as coherent radiation from a laser, than the transmissive measuring system so that the beams reflect off of the substrate. The wavelength of the beams may preferably be less than 1100 nanometers and may preferably be about 530 nanometers.

The beams produced by the beam generator pass through a beam splitter 148 unaffected and are focused onto the surface of the substrate. As described above, the analyzer beam strikes the doped region of the substrate, and the reference beam strikes an undoped region of the substrate. In this system, both beams reflect from the surface. The analyzer beam is reflected by both the change in index of refraction at the surface of the doped region as well as the graded change in the index of refraction caused by the graded doping level of the doped region. The reference beam is reflected by the surface alone. The reflected beams are then directed to a detector 150, by the beam splitter 148. The detector, as described above, detects the phase shift of the analyzer beam relative to the reference beam and determines the doping level of the doped region.

Figure 5:
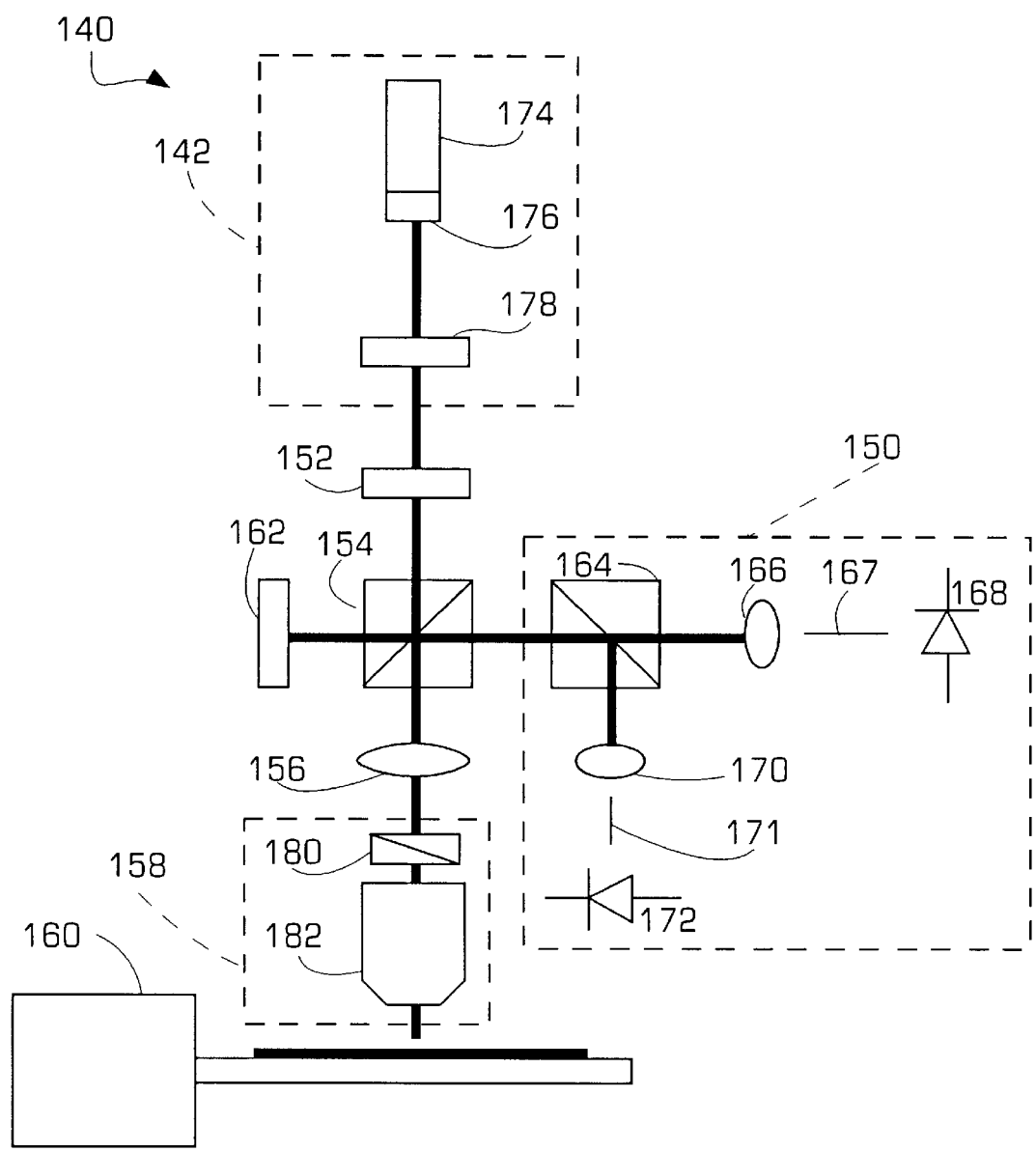
FIG. 5 is a more detailed block diagram of the reflective type doping level measuring system.

FIG. 5 is a more detailed block diagram of the reflective type doping level measuring system 140 that may include the beam generator 142, and the detector 150, as described above. The reflective type doping level measuring system has fewer elements than the transmissive type system because the optical path of the generated beams and of the reflected beams are the same so fewer optical components are needed. A coherent beam of electromagnetic radiation that may have a wavelength of less than 1100 nanometers, and may preferably be about 530 nanonmeters, is circularly polarized, as described above, and may be generated by the beam generator 142 and passes through an attenuator 152 to vary the intensity of the beam for purposes of measuring the phase shift caused by a thin film on the surface of the substrates described below. The beams for this relective system have a photon energy that is greater than the band gap of the substrate so that the beams reflect off of the surface of the substrate. The beam then strikes a non-polarizing beam splitter 154 which is used to direct the reflected beam to the detector and does not affect the generated beam.

The beam then goes through a lens 156 that matches the back focal length of an objective in the focusing system 158. The focusing system 158 splits the beam into an analyzer beam and a reference beam, as described below, and focuses those two beams on to the surface of the substrate. A substrate positioning system 160 positions the substrate relative to the doping profile measuring system and may include a stage (not shown) for supporting the substrate. A camera system may also be included as in the transmissive system to position the beam in a pattern on the substrate.

The analyzer beam and reference beam are reflected back from the surface of the substrate, and pass back through the focusing system 158, where the analyzer beam and reference beam are combined back into one single reflected beam. The single reflected beam is then split by the beam splitter 154 between the detector 150 and a path back to the laser. The portion of the beam that is reflected back to the laser does not enter the laser because an isolator, as described, below blocks the energy. An attenuator 162 may also absorb some of the energy of the beam reflected back towards the laser.

The other portion of the beam enters the detector 150, and strikes a polarizing beam splitter 164 that is oriented at a 45° angle to the analyzer beam polarization and the reference beam polarization, and produces a sum of the electric fields of the analyzer beam and reference beam signal, through a lens 166 and optical fiber 167 at a first detector 168, and a difference of the electric fields of the analyzer beam and the reference beam signal, through a lens 170, and an optical fiber 171 at a second detector 172. For autofocus at the surface of the substrate, the lens 166 focuses the beam in the end of the optical fiber 167. The end of the optical fiber is located at the focus of lens 166. The maximum signal is generated by the photocell 168 when the surface of the substrate is at the focus of the objective 182. Then, as described below, the phase shift of the analyzer beam relative to the reference beam may be determined by a subtractor (not shown) which subtracts the sum signal and the difference signal to determine the phase shift. A processor (not shown) in the detector may determine the doping level of the doped region of the substrate from the phase shift, as described below.

The beam generator 142 may further include a laser 174 for generating the 530 nanometer wavelength beam, a beam expander 176 for expanding the size of the beam to fill the objective of the focusing system, and an isolator for preventing any reflected light from entering the laser. The focusing system 158 may further include a separation system 180, that may be a Wollaston prism, for creating an analyzer beam with a first polarization, and a reference beam with a second polarization from the single beam generated by the beam generator. The focusing system may also include an objective 182 for focusing the analyzer beam and reference beam onto the substrate, and for focusing the reflected beams back into the prism.

To compensate for a thin film that might cover the undoped region of the substrate, the intensity of the beam from the beam generator is increased by removing the attenuator 152 so that a carrier concentration is generated, under both beams, in the substrate. At this high intensity level, the conductivity and index of refraction of the substrate is the same underneath both beams because the index of refraction change caused by the carriers generated is much greater than any index of refraction change caused by the doped region so that any phase shift between the two beams is a result of the thin film. In this manner, the phase shift due to the thin film may be determined. Now, the determination of the phase shift and doping levels for the reflective type doping level measuring system, in accordance with the invention, will be described.

In this reflective embodiment of the doping level measuring system, since the beams reflect off of the surface of a doped region of the substrate, a slightly different analysis may be used to determine the relationship between the phase shift of the analyzer beam relative to the reference beam, and the doping level. First, it is known, as described above, that a doped region of a substrate has a higher index of refraction and a higher conductivity than an undoped region. The reflection coefficient, $r_s$, for an uncoated substrate that determines how a beam will reflect off of a surface is a function of the index of refraction, $n_s$, of the substrate, and may be given by:

$$r_s = \frac{1 - n_s}{1 + n_s} \tag{12}$$

Thus, the reflection coefficient may be determined, and the phase shift of the analyzer beam relative to the reference beam and the doping level of the doped region of the substrate may be determined, in the following manner. First, assuming that the beam is equally split so that each polarization component has equal power, the reflected electric field strength of the beams are:

$$E_{sr} = r_d(z,k) E_0 e^{j\phi} \tag{13}$$

$$E_{pr} = r_u(k) E_0 \tag{14}$$

where $r_d$ and $r_u$ are the reflection coefficients at the surface of the doped region and the undoped region, respectively, z is the depth of penetration of the beams into the substrate, k is the wavenumber of the beams ($k=2\pi/\lambda$), and $e^{j\phi}$ represents the initial phase shift between the analyzer beam and the reference beam. A portion of this signal may be caused by a thin film over the undoped region of the substrate, that may be compensated for, as described above. The variable $r_u(k)$ may be determined by measuring the reflectance of the undoped region while varying the wavelength of a secondary electromagnetic energy source, such as a white light source and a monochrometer, which is a conventional method to determine the optical properties of thin film optical coatings.

The polarizing beam splitter in the detector produces sum and difference of the electric field signals at the first and second detectors, as described above, and the detectors produce the following sum signal and difference signal:

$$\frac{1}{4} |E_{sr} + E_{pr}|^2 = \frac{P_l}{4} |r_d e^{j\phi} + r_u|^2 = \frac{P_l}{4} (r_d^2 + r_u^2 + r_u(r_d * e^{j\phi} + r_d e^{j\phi})) \tag{15}$$

$$\frac{1}{4} |E_{sr} - E_{pr}|^2 = \frac{P_l}{4} |r_d e^{j\phi} - r_u|^2 = \frac{P_l}{4} (r_d^2 + r_u^2 - r_u(r_d * e^{j\phi} + r_d e^{j\phi})) \tag{16}$$

If the difference of the sum and difference signal is taken, then an equation relating the power of the signal to the reflection coefficient is found, which is:

$$P_s = \frac{P_l r_u}{2} (r*_d e^{-j\phi} + r_d e^{j\phi}) \tag{17}$$

From this equation, one may determine the doping level of the doped region of the substrate assuming that the ideal doping profile for the doped region is known. As described above, each doping process generates a certain type of doping profile. Thus, for example, for ion implantation, a gaussian profile is assumed. From this ideal doping profile, it is known that the index of refraction for the doped region varies due to the doping profile. Thus, any reflection by the substrate occurs due to both the abrupt index of refraction change at the surface of the substrate and the slower changing index of refraction due to the doping profile. The surface reflection is given by:

$$r_s = \frac{1 - n_s}{1 + n_s} \tag{18}$$

where $n_s$ is the index of refraction of the surface of the substrate. The reflection caused by the doped region, r(z), is a function of the resistivity of the doped region, and is given by:

$$r(z) = \frac{n(z) - n(z + dz)}{n(z) + n(z + dz)} \approx \frac{dn(z)}{2n_o} = \frac{1}{2n_o} \cdot \frac{dn}{d\rho(z)} \cdot \frac{d\rho(z)}{dz} \cdot dz \tag{19}$$

where n(z) and n(z+dz) are the reflection coefficients at a depth z and an infinitessimally deeper depth dz respectively, no is the index of refraction of the substrate, and p(z) is the resistivity of the substrate at depth z. From equation 3, one may determine that the change in the reflection coefficient is a function of the change in resistivity, and is given by the following equation:

$$\frac{dn}{dp} \approx -2n_o \frac{\rho_o^2}{\rho^3} \tag{20}$$

where $\rho_0$, is given by:

$$\rho_o = \frac{\sigma_c \lambda}{\sqrt{2ce}} \tag{21}$$

and is correct is $\rho \gg \rho_0$. Thus, for a wavelength of 530 nanometers, $\rho_0$ is approximately $9 \times 10^{-5}$ ohm-cm.

When equations 17, 19, 20 and 21 are combined together, a relationship between the power of the signal, $P_s$, and resistivity, $\rho$ is established, which is:

$$P_s = r_u P_l \left[ r_s \cos(\phi) - \int_0^\infty e^{-\alpha(k)z} \frac{\rho_o^2}{\rho^3} \cdot \frac{d\rho}{dz} \cdot \cos(2kz + \phi) \cdot dz \right] \tag{22}$$

The term $e^{-\alpha(k)z}$ accounts for the absorption of the incident light as a function of depth. The term $\cos(2kz)$ arises because light reflected from a depth z in the substrate undergoes a phase shift of 2kz to reach that depth and return to the surface. The integral in the equation is a function of well known factors, including the resistivity as a function of depth, and the gradient of the resistivity as a function of depth. Due to the type of doping process used, the resistivity and its gradient are known values. By varying the frequency of the analyzer and reference beam (i.e., by measuring at multiple frequencies) and measuring the resultant signal, a curve may be fit using equation 22 to determine the resistivity of the doped region as a function of depth. Once the resistivity is known, the doping level of the doped region is a well known function of the resistivity and may be determined. Once the doping level at several locations within the doped region are determined, one can determine the doping distribution or profile of the doped region. Now, a semiconductor fabrication line with a doping level measuring system, in accordance with the invention, will be described with reference to FIG. 6.

Figure 6:
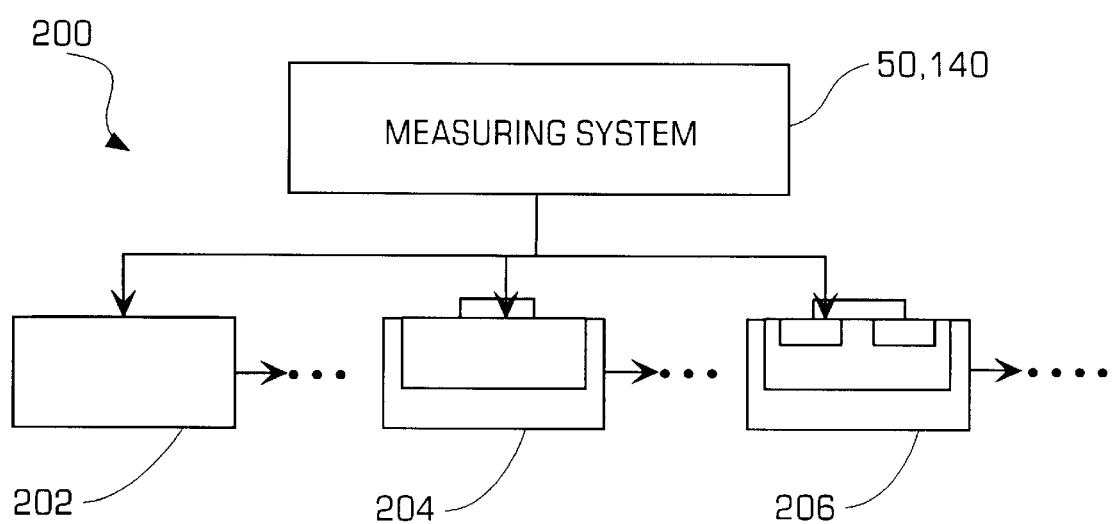
FIG. 6 is a block diagram of a semiconductor fabrication line having a direct doping profile measuring system, in accordance with the invention.

FIG. 6 is a block diagram showing a partial semiconductor fabrication line 200 with the doping profile measuring system, in accordance with the invention. A reflective type doping level measuring system 140, or a transmissive type doping level measuring system 50 may be used. The measuring system, as shown, may be positioned at various points in the fabrication process to measure the doping level of different regions of the substrate. The various stations of the fabrication process are shown, with a measuring system that may represent several measuring stations positioned at different locations in the fabrication line. The fabrication line 200 may include a P-well forming station 202 in which the P-well of a transistor is formed, a gate oxide formation station 204 where the Gate insulator is formed, and a doping station 206 where the source and drain regions of the transistor are formed. A partial fabrication line, showing the stations where the doping level or doping profile of a region of the substrate is changed, is shown for clarity. As shown, either the transmissive measuring system 50, or the reflective measuring system 140, may be used to measure various electrical characteristics after each of these stations. As set forth in the table below, various characteristics may be measured during a semiconductor fabrication line, at various times.

TABLE 1

ELECTRICAL MEASUREMENTS IN A 0.25 μm
FABRICATION PROCESS

| Process Step | Dopant Profile |
| --- | --- |
| N-well oxide | |
| N-well Drive In | X |
| P-well oxide & drive in | X |
| Pad Oxide | |
| α-Si and Nitride | |
| Field Vt Implant | |
| Field Oxide | X |
| N and p Vt Implant | |
| gate Oxide | X |
| N and P LDD Implants | |
| S/D Oxide | |
| S/D Implants | |
| S/D Anneal | X |
| Silicide Deposition | |
| Silicidation | |
| Deposition, Densify BPSG | |
| Form 5 layer metal | |

The doping level measuring system, including both the transmissive type measuring system and the reflective type measuring system, in accordance with the invention, may be used to measure the doping profile, as described above at a number of stages in the production of the transistor by a fabrication line. Similarly, the measuring system of the invention may measure various electrical characteristics of any semiconductor process on any substrate, and is not limited to any particular type of semiconductor device or any particular type of substrate. The doping level measuring system may by used to control the fabrication line in real-time because doping level measurements may be made accurately and quickly so that the fabrication process may be stopped if an incorrect doping level is measured, and the fabrication process changed.

Figure 7:
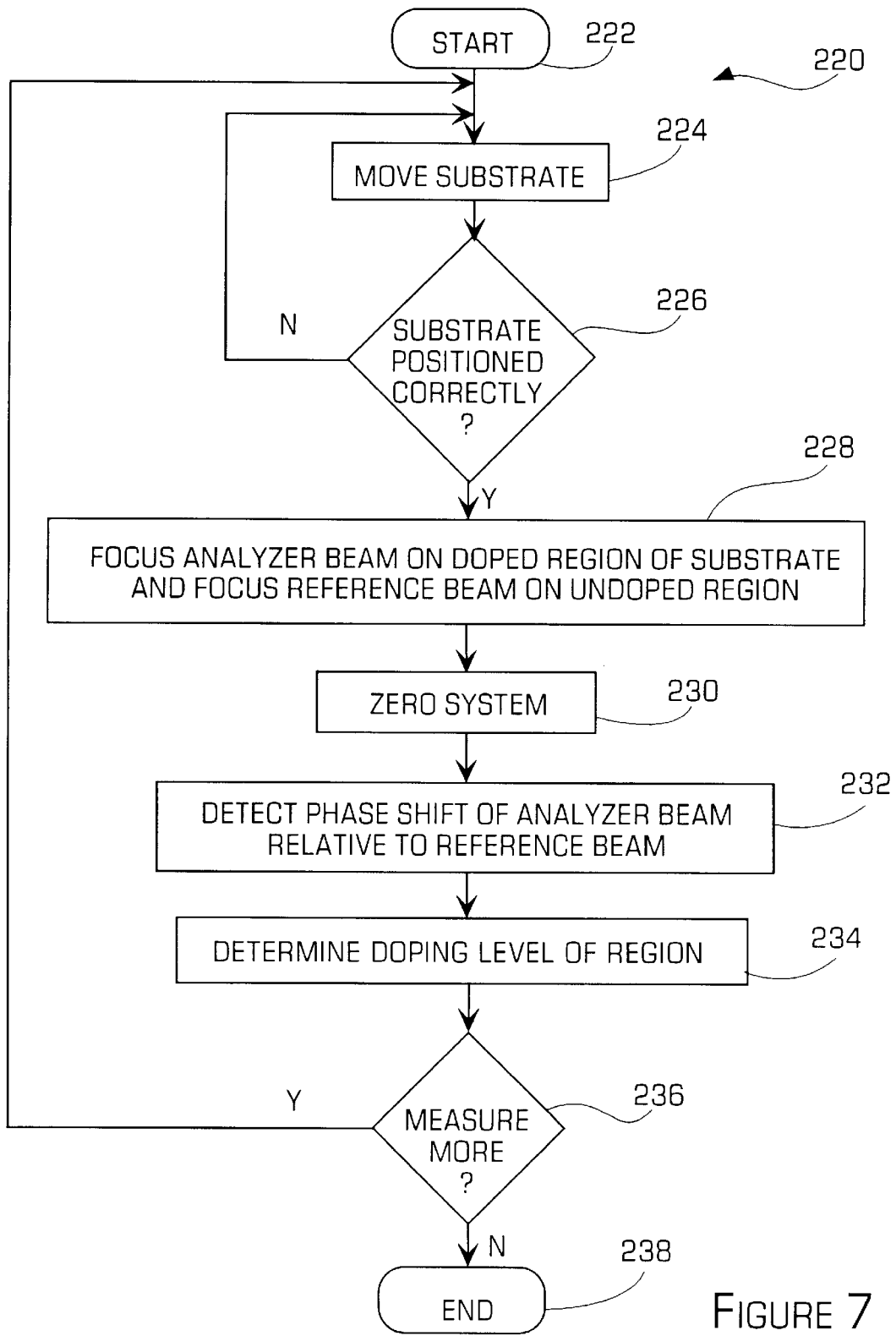
FIG. 7 is a flowchart showing a method of directly measuring a doping profile of a semiconductor substrate, in accordance with the invention.

FIG. 7 is a flowchart of a method 220 of measuring the doping level of a region in a semiconductor substrate, in accordance with the invention. The method begins in step 222, and in step 224, the substrate is positioned and examined through the examining system. In step 226, it is determined whether or not the substrate has been properly aligned. If not, then control returns to step 224 where the substrate is positioned again. If the substrate is correctly positioned, then in step 228, the analyzer beam and the reference beam are directed towards the substrate and either pass through the substrate or reflect off of the substrate, depending on the type of doping level measurement system. The measuring system is reset and zeroed by focusing both beams on the same region to determine and compensate for any phase shift error inherent in the system in step 230. In addition, compensation may occur for any thin film on the semiconductor substrate, as described above. In step 232, the phase shift of the analyzer beam relative to the reference beam is determined, as described above, and in step 234, the doping level of the semiconductor substrate is determined from the phase shift of the analyzer beam relative to the reference beam, as described above. It is then determined whether another region of the substrate needs to be measured in step 236. If another measurement is being made, then control returns to step 224. If no additional measurements are being made, then the method ends at step 238.

Figure 8:
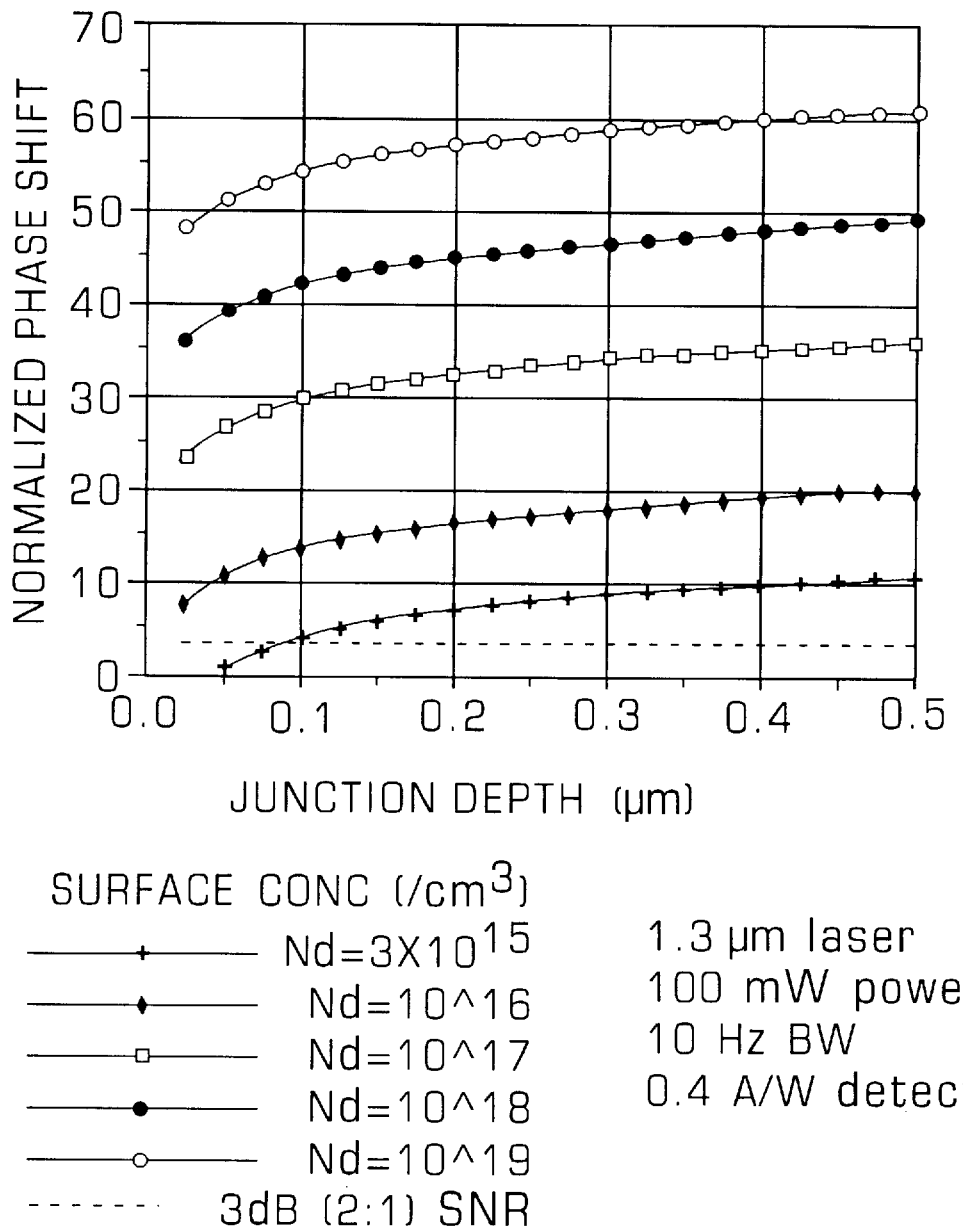
FIG. 8 is a chart showing the relationship between the phase shift of the analyzer beam normalized for constant shot noise and the junction depth and doping level of the substrate.

FIG. 8 is a chart showing the relationship between the phase shift of the analyzer beam, and the doping level and junction depth of the semiconductor region. The depth of the region being measured is known because the fabrication process itself is known. For example, a region with a 0.4 μm junction depth, that causes 60 μradians of phase shift of the analyzer beam has a doping level of $10^{19}$ doping atoms per $cm^3$. Thus, for a known junction depth and a measured phase shift, a doping level of the region of the substrate may be determined. As shown, most of the doping levels may be measured for junction depths ranging from 0.05 μm to 0.5 μm. This range of junction depths covers most depths of doped regions in semiconductor devices. For a doping level of $3 \times 10^{15}$ atoms/$cm^3$, the doping level may be measured down to less than 0.1 μm before the 2:1 signal to noise ratio threshold is crossed. Thus, even for the more lightly doped regions, the junction depths can still be measured down to 0.1 μm which still covers most doped regions of most semiconductor regions.

While the foregoing has been with reference to particular embodiments of the invention, it will be appreciated by those skilled in the art that changes in these embodiments may be made without departing from the principles and spirit of the invention, the scope of which is defined by the appended claims.

I claim:

1. A system for measuring the doping levels of a doped region in a semiconductor substrate, comprising:

means for generating an analyzer beam and a reference beam, the analyzer and reference beams being substantially parallel and spaced apart from each other so that the analyzer and reference beams are non-overlapping;

means for focusing the analyzer beam on a preselected doped region of the substrate and for focusing the reference beam on an undoped region of the substrate, the doped region generating a phase shift of the analyzer beam relative to the reference beam corresponding to a level of doping of the doped region of the substrate;

means for detecting the phase shift of the analyzer beam relative to the reference beam; and means responsive to the detecting means for determining the doping level of the substrate in the preselected doped region.

2. The system of claim 1, wherein the beams are about 1 micrometer wide.

3. The system of claim 1, wherein the preselected doped region comprises a region of a field effect transistor.

4. The system of claim 1, wherein the undoped region is adjacent to the doped region of the substrate.

5. The system of claim 1, wherein the analyzer beam and the reference beam are spaced apart from each other by about 1 micrometer.

6. The system of claim 1, wherein the analyzer beam has a first polarization and the reference beam has a second polarization, and wherein the detecting means comprises means for combining the analyzer beam and the reference beam into a single beam having two components respectively having said first polarization and said second polarization.

7. The system of claim 6, wherein the detecting means further comprises means for generating a sum signal corresponding to a sum of the electric fields of the analyzer beam and reference beam, means for generating a difference signal corresponding to the difference of the electric fields of the analyzer beam and reference beam, and means for subtracting the sum signal and difference signal to generate another signal corresponding to the phase shift of the analyzer beam relative to the reference beam.

8. The system of claim 1, wherein the determining means comprises means for determining a resistivity of the doped region of the substrate from the phase shift of the analyzer beam relative to the reference beam, and wherein the means for determining the doping level of the doped region of the substrate comprises means for determining the doping level from the resistivity.

9. The system of claim 1, wherein the focusing means comprises means for positioning the substrate so that the analyzer beam is focused on a doped region of the substrate.

10. The system of claim 1, wherein the focusing means comprises means for scanning the analyzer beam across the doped region of the substrate to generate a plurality of doping level measurements at a plurality of locations in the doped region, and means for determining a doping profile of the doped region of the substrate from the plurality of the doping level measurements.

11. The system of claim 1 further comprising means for compensating the detected phase shift signal for a phase shift error caused by a film on the surface of the substrate.

12. The system of claim 11, wherein the compensating means comprises means for generating a beam having a wavelength above the bandgap of the substrate to generate carriers in the substrate such that the phase shift of the analyzer beam is substantially caused by the film, and means for measuring the phase shift generated by the film.

13. The system of claim 1, wherein the focusing means comprises means for selecting the wavelengths of the analyzer beam and reference beam so that both beams pass through the substrate.

14. The system of claim 13, wherein the photon energy of the analyzer beam and the reference beam are less than the bandgap of the substrate.

15. The system of claim 1, wherein the focusing means comprises means for selecting the wavelengths of the analyzer beam and the reference beam so that both beams reflect off of the surface of the substrate.

16. The system of claim 15, wherein the photon energy of the analyzer beam and the reference beam are greater than the bandgap of the substrate.

17. The system of claim 1, wherein the generating means comprises means for generating multiple wavelengths in order to determine a fit for a predetermined profile fucntion.

18. The system of claim 17, wherein the multiple wavelength generation means comprises multiple lasers.

19. A method of measuring the doping levels of a doped region in a semiconductor substrate, comprising:

generating an analyzer beam and a reference beam, the analyzer and reference beams being substantially parallel and spaced apart from each other so that the analyzer and reference beams are non-overlapping;

focusing the analyzer beam on a preselected doped region of the substrate and for focusing the reference beam on an undoped region of the substrate, the doped region generating a phase shift of the analyzer beam relative to the reference beam corresponding to a level of doping of the doped region of the substrate;

detecting the phase shift of the analyzer beam relative to the reference beam; and determining the doping level of the substrate in the preselected doped region from the phase shift detected.

20. The method of claim 19, wherein the beams are about 1 micrometer wide.

21. The method of claim 19, wherein the preselected doped region comprises a region of a field effect transistor.

22. The method of claim 19, wherein the undoped region is adjacent to the doped region of the substrate.

23. The method of claim 19, wherein the analyzer beam and the reference beam are spaced apart from each other by about 1 micrometer.

24. The method of claim 19, wherein the analyzer beam has a first polarization and the reference beam has a second polarization, and wherein detecting the phase shift comprises combining the analyzer beam and the reference beam into a single beam having two components respectively having said first polarization and said second polarization.

25. The method of claim 24, wherein detecting the phase shift further comprises generating a sum signal corresponding to a sum of the electric fields of the analyzer beam and reference beam, generating a difference signal corresponding to the difference of the electric fields of the analyzer beam and reference beam, and subtracting the sum signal and difference signal to generate another signal corresponding to the phase shift of the analyzer beam relative to the reference beam.

26. The method of claim 19, wherein determining the doping level comprises determining a resistivity of the doped region of the substrate from the phase shift of the analyzer beam relative to the reference beam, and determining the doping level of the doped region of the substrate from the resistivity.

27. The method of claim 19, wherein focusing the beams comprises positioning the substrate so that the analyzer beam is focused on a doped region of the substrate.

28. The method of claim 19, wherein focusing the beams comprises scanning the analyzer beam across the doped region of the substrate to generate a plurality of doping level measurements at a plurality of locations in the doped region, and determining a doping profile of the doped region of the substrate from the plurality of the doping level measurements.

29. The method of claim 19 further comprising compensating the detected phase shift signal for a phase shift error caused by a film on the surface of the substrate.

30. The method of claim 29, wherein compensating comprises generating a beam having a wavelength above the bandgap of the substrate to generate carriers in the substrate such that the phase shift of the analyzer beam is substantially caused by the film, and measuring the phase shift generated by the film.

31. The method of claim 19, wherein focusing the beams comprises selecting the wavelengths of the analyzer beam and reference beam so that both beams pass through the substrate.

32. The method of claim 31, wherein the photon energy of the analyzer beam and the reference beam are less than the bandgap of the substrate.

33. The method of claim 19, wherein focusing the beams comprises selecting the wavelengths of the analyzer beam and the reference beam so that both beams reflect off of the surface of the substrate.

34. The method of claim 33, wherein the photon energy of the analyzer beam and the reference beam are greater than the bandgap of the substrate.

35. The method of claim 19, wherein generating the beams comprises generating multiple wavelengths in order to determine a fit for a predetermined profile fucntion.

36. The system of claim 35, wherein the generating multiple wavelength comprises multiple lasers.

37. A method for measuring the doping levels of a doped region of a device in a substrate during a fabrication process of the substrate, the fabrication process including a series of successive processing steps performed on the substrate to form the device, the method of measuring the doping levels in the substrate, comprising:

generating an analyzer beam and a reference beam, the analyzer and reference beams being substantially parallel and spaced apart from each other so that the analyzer and reference beams are non-overlapping;

focusing the analyzer beam on a preselected doped region of the substrate and focusing the reference beam on an undoped region of the substrate to generate a phase shift of the analyzer beam relative to the reference beam, the phase shift corresponding to a level of doping of the doped region of the substrate;

detecting the phase shift of the analyzer beam relative to the reference beam; and determining, in response to the phase shift, the doping level of the substrate.

38. The method of claim 37, further comprising controlling the fabrication process in real time based on the measured doping level of the preselected doped region of the substrate.

39. The method of claim 37, wherein the focusing comprises scanning the analyzer beam across the doped region of the substrate to generate a plurality of doping level measurements at a plurality of locations in the doped region, and determining a doping profile of the doped region of the substrate from the plurality of the doping level measurements.

40. The method of claim 38, further comprising selecting the wavelengths of the analyzer beam and reference beam so that both beams pass through the substrate.

41. The method of claim 40, wherein the photon energy of the analyzer beam and the reference beam are less than the bandgap of the substrate.

42. The method of claim 38, further comprising selecting the wavelengths of the analyzer beam and reference beam so that both beams reflect off of the substrate.

43. The method of claim 42, wherein the photon energy of the analyzer beam and the reference beam are greater than the bandgap of the substrate.

* * * * *